United States Patent [19]

Lane

[11] 4,434,402
[45] Feb. 28, 1984

[54] ELECTRICAL EQUIPMENT
[75] Inventor: Michael J. Lane, Mablethorpe, England
[73] Assignee: Smiths Industries Public Limited Company, London, England
[21] Appl. No.: 291,692
[22] Filed: Aug. 10, 1981
[30] Foreign Application Priority Data
   Aug. 23, 1980 [GB] United Kingdom ............... 8027514
[51] Int. Cl.³ .................... G01R 31/024; G01R 31/22
[52] U.S. Cl. ..................................... 324/393; 324/122
[58] Field of Search ............... 307/110, 252 H, 252 J; 363/53–68; 328/66–68; 324/393, 122
[56] References Cited
   U.S. PATENT DOCUMENTS
   3,049,642  8/1962  Quinn ...................... 307/252 H X
   3,119,068  1/1964  Rosenthal ................. 328/66 X
   3,271,593  9/1966  Devilbiss ................. 307/252 H
   3,963,945  6/1976  Colyn ..................... 328/67 X Primary Examiner—Stanley T. Krawczewicz
Assistant Examiner—Jose M. Solis
Attorney, Agent, or Firm—Pollock, Vande Sande & Priddy

[57] ABSTRACT

An igniter test unit produces a square wave voltage that is applied across a parallel circuit comprising a first capacitor and a series arrangement of a second capacitor and diodes. An inductance and a thyristor are connected across the first capacitor, in series. When the thyristor is rendered conductive the voltage across the diodes becomes the sum of the voltages across the capacitors, this voltage being applied across the igniter. Switching of the thyristor is controlled such that the voltage is applied to the igniter in increasing steps of 25 volts until the breakdown occurs at the same voltage five times in succession. The voltage across the igniter is determined by applying it across a capacitive divider, one capacitor being discharged in steps, and the number of steps required to reduce the voltage to a reference value is counted.

9 Claims, 3 Drawing Figures

ELECTRICAL EQUIPMENT

BACKGROUND OF THE INVENTION

This invention relates to electrical equipment.

The invention is more particularly concerned with equipment for testing operation of electrical igniters.

To test correct functioning of an igniter, and especially an igniter for a gas-turbine engine, a measure is taken of the minimum voltage at which the igniter fires for a prescribed number of times in succession. This is done in practice by manually setting the value of a voltage source which may be of various different constructions. The voltage source produces a voltage pulse across the igniter and, if it does not fire, the operator sets the voltage to a higher value and the procedure is repeated. When the igniter does fire, the procedure is repeated at the same voltage and, if the igniter fires again, and does this five times in succession, this is deemed to be the igniter onset voltage. If, however, the igniter fails to fire five times, the voltage must be increased again until this does happen.

This is a relatively lengthy procedure and the provision of suitable equipment capable of producing a high voltage pulse of adjustable value has presented various difficulties.

BRIEF SUMMARY OF THE INVENTION

It is an object of the present invention to provide test equipment that can be used to provide a high voltage pulse and facilitate the testing procedure.

According to one aspect of the present invention there is provided equipment for producing an output voltage pulse including: first capacitive means; second capacitive means connected in series with rectifier means, said second capacitive means and said rectifier means being connected in parallel with said first capacitive means; and inductance means connected in series with a thyristor, said inductance means and said thyristor being connected in parallel with said first capacitive means, and wherein said equipment is arranged such that when said thyristor is rendered conductive an output voltage is produced across said rectifier means that is substantially equal to the sum of the voltages across said first and second capacitive means.

The first and second capacitive means may be progressively charged by a pulsed voltage signal. The equipment may be used for testing electrical igniters and, in this respect, may be arranged to apply across the igniter a voltage that automatically increases in value each time said voltage is applied until breakdown occurs of said igniter repeatedly at the same voltage for a predetermined number of times, said equipment being arranged to provide a representation of the voltage at which said repeated breakdown occurs.

According to another aspect of the present invention there is provided equipment for use in testing operation of electrical igniters, including capacitive means arranged for connection with an igniter, means for increasing the voltage across said capacitive means, means for automatically applying an output voltage developed across said capacitive means to said igniter at predetermined intervals, means for sensing breakdown of said igniter, said equipment being arranged automatically to apply the same voltage across said igniter repeatedly for a predetermined number of times if breakdown occurs, and to provide a representation of the voltage at which said repeated breakdown occurs.

Means for providing a representation of the output voltage may include further capacitive means across which the voltage is applied, means for discharging said further capacitive means intermittently such that the voltage across said further capacitive means is progressively reduced from its initial value to a lower predetermined value, and counter means for providing a count of the number of times said further capacitive means is discharged thereby providing an indication of the initial voltage across said further capacitive means.

Test equipment for measuring the onset voltage of igniters of an aircraft gas-turbine engine, will now be described, by way of example, with reference to the accompanying drawings.

DETAILED DESCRIPTION

Figure 1:
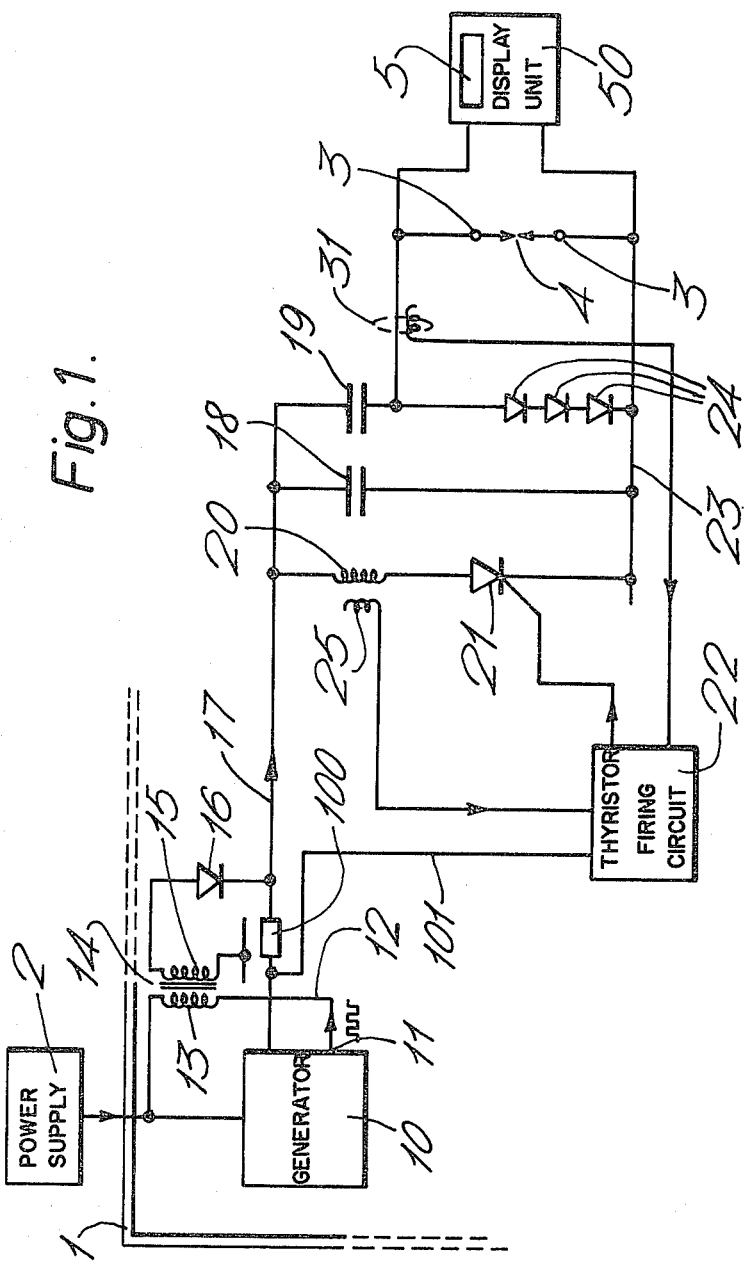
FIG. 1 represents the equipment schematically.

The onset voltage test equipment comprises a single housing 1 to which a source of power, such as an aircraft power supply, or an independent power supply 2, is connected. The test equipment has a high voltage output terminal 3 across which a gas-turbine engine igniter 4 is connected. The test equipment provides an output voltage across the igniter 4 that increases in steps of, for example, 25 volts until the igniter fires five times consecutively at the same voltage, that is until the onset voltage is reached. The onset voltage value is displayed on a display panel 5. The value of the voltage steps and the number of times that the igniter must fire can be adjusted appropriately for different igniters and different test requirements.

The power supply 2 has a nominal 28 volt d.c. output that is applied to the input of an EHT generator 10 which functions as a constant current source having a 3 kV upper voltage limit. Generator 10 is in itself conventional, operates to produce a pulsed voltage output, and may take one of the circuit configurations shown for example in "Semiconductor Circuit Design" by Bryan Norris, Vol. 4, Section 1, Chapters IV and V (published by Texas Instruments, 1975). The output 11 of the generator 10 supplies a square wave voltage train along line 12 to the primary winding 13 of a step-up transformer 14. The output voltage from the secondary winding 15 is rectified by a diode 16 and is applied via line 17 across a pair of parallel connected capacitors 18 and 19.

A series-connected inductance 20 and thyristor 21 (Mullard BTW92 1600R) are connected across the parallel pair of capacitors 18 and 19. The thyristor 21 is normally held off, that is, non-conductive, and is turned on, that is, rendered conductive, by a thyristor firing circuit 22 the operation of which will be explained in greater detail later. The capacitor 19 is connected to a ground line 23 via three series-connected diodes 24, the output terminal 3 of the equipment being provided across these diodes. Current flowing through the inductance 20 is tapped off by an inductive winding 25 and supplied to the thyristor firing circuit 22 to give an indication of the voltage across the capacitors 18 and 19.

In operation, the capacitors 18 and 19 and the step-up transformer 14 act as a ringing-choke circuit, the voltage across the capacitors gradually increasing with each pulse of current in line 17. When the required voltage is reached, as determined by the current in line 101, the circuit 22 causes the thyristor 21 to be fired thereby causing a parallel tuned circuit to be formed. The voltage across the first capacitor 18 then swings negative forcing the output electrode of the second capacitor 19 more negative and producing a voltage doubling across the output terminal 3. As soon as the voltage across capacitor 18 swing negative it causes the thyristor 21 to turn off until it is fired again.

Figure 2:
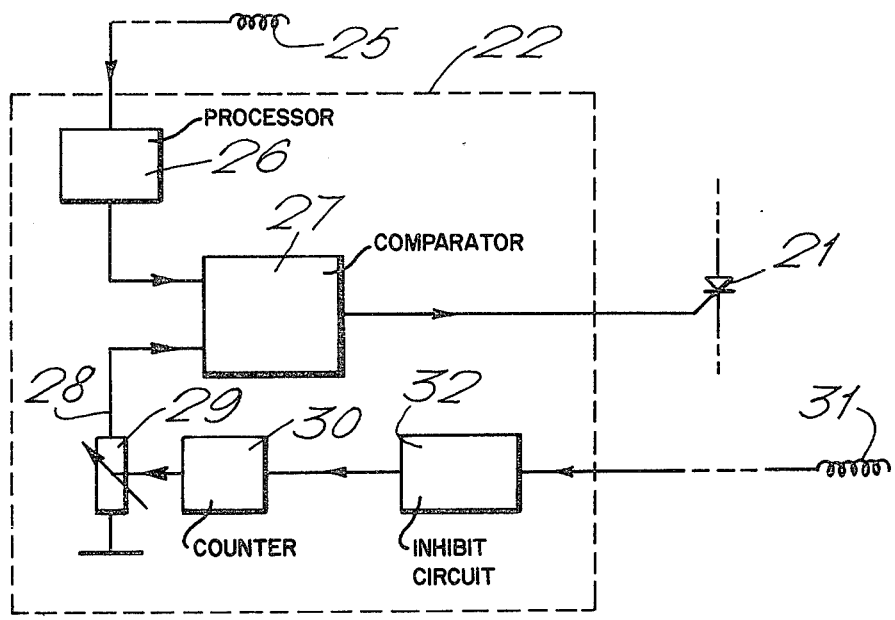
FIG. 2 represents schematically the thyristor firing circuit comprising a part of the equipment of FIG. 1.

The thyristor firing circuit 22 is shown in greater detail in FIG. 2 and is arranged to fire the thyristor 21 to produce a voltage across the igniter 4 that increases in steps of 25 volts. The circuit 22 receives current signals from the winding 25 indicative of the voltage that has been produced across the igniter 4.

These signals are processed by a unit 26 and supplied to a comparator unit 27. The comparator unit 27 also receives signals on line 28 indicative of current flow through an electronically-variable resistance unit 29. The resistance unit 29 is controlled by a counter unit 30 which increases the value of the current by reducing the resistance in steps equivalent to 25 volts each time the thyristor 21 is fired. The resistance unit 29 comprises a series of parallel connected fixed resistors (not shown) which are switched into operation by means of a number of series-connected transistors that are rendered conductive appropriately by the counter unit 30.

A second pick-off winding 31 senses when current flows through the igniter 4, that is, on breakdown or firing of the igniter, and supplies signals to an inhibit circuit 32 within the firing circuit 22. When breakdown of the igniter 4 occurs, the inhibit circuit 32 supplies a signal to the counter unit 30 preventing change of the value of the resistance unit 29. The charge on the capacitors 18 and 19 is allowed to increase again and if the igniter 4 breaks down at or below the previous value the counter 30 remains inhibited. This is repeated until the igniter 4 has fired at the same voltage five times in succession and this is deemed to be the onset voltage which is displayed on the panel 5, further testing being stopped. If the igniter 4 does not fire for the prescribed number of times in succession its voltage is increased by another 25 volts and the procedure repeated.

Figure 3:
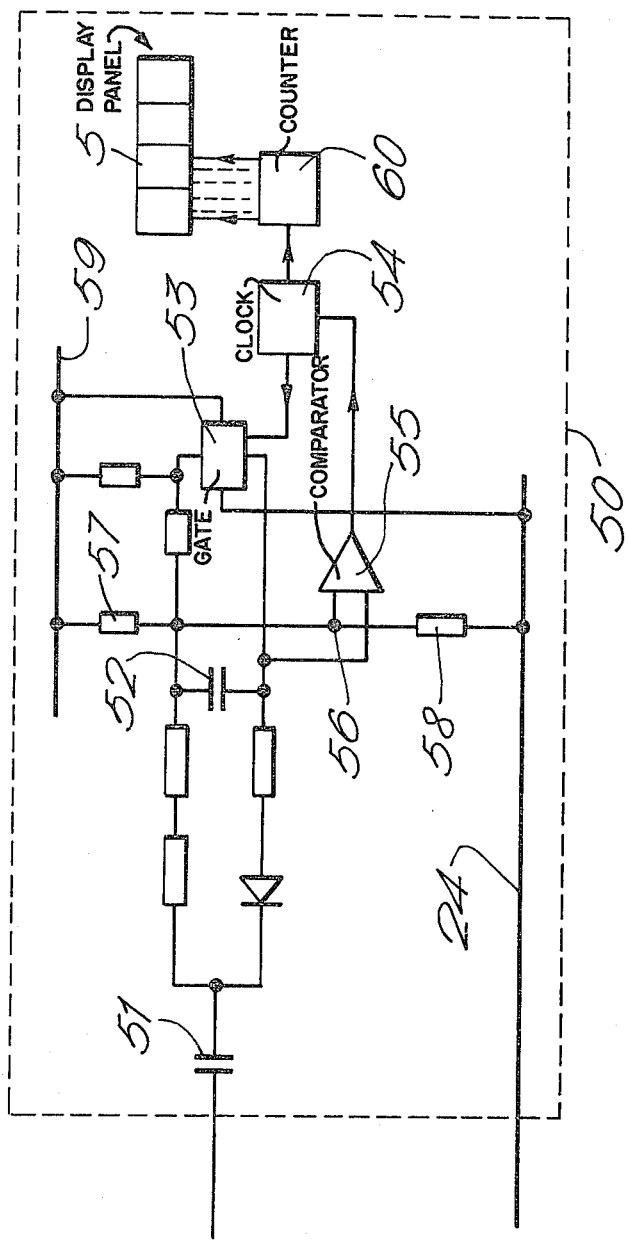
FIG. 3 represents schematically the voltage display unit comprising another part of the equipment of FIG. 1.

The voltage across the igniter 4 is applied across a voltage display unit 50 which is shown in greater detail in FIG. 3 and which provides a display of voltage on the panel 5. The voltage across the igniter 4, which may be up to about 3 kV, is applied across a capacitive divider formed by two series-connected capacitors 51 and 52. One capacitor 51 is of 0.001 $\mu$F and the other capacitor 52 is one thousand times larger, that is, 1 $\mu$F, so that the voltage across the larger capacitor is correspondingly lower; by measuring this voltage, an indication of the voltage across the igniter 4 is obtained. A transfer gate, or analogue switch 53 is connected across the larger capacitor 52, the gate being controlled by a clock unit 54. One electrode of the larger capacitor 52 is also connected to an input of a comparator 55, the other input of which is connected to a reference point 56 of a constant, low voltage. The reference voltage point 56 is established by a potential divider formed by two fixed resistors 57 and 58 that are connected in series between the ground line 3 and a positive voltage line 59.

The clock unit 54 is arranged repeatedly to close and open the transfer gate 53 for short periods of fixed duration so that the capacitor 52 is progressively discharged from its initial full voltage to a zero or low voltage. Each time the gate 53 is opened a pulse is also supplied by the clock 54 to a counter unit 60. The voltage across the capacitor 52 is continuously compared by the comparator 55 with the low reference voltage at the point 56. When the charge on the capacitor 52 is equal to or less than the reference voltage, the comparator 55 supplies signals to the clock unit 54 to stop further discharge of the capacitor. The number of times that the gate 53 has to be opened to discharge the capacitor 52 from its initial voltage to the reference voltage is indicative of the initial charge on the capacitor and hence the voltage across the igniter 4. The counter 60 supplies a signal to the display panel 5 in accordance with the number of times the gate 53 has been opened, the signal being in a suitable form for energization of the panel 5. The display panel 5 is a four-digit panel of the incandescent filament type although it will be appreciated that other forms of display could be provided or that the output of the counter could be supplied to some form of recording or storage equipment.

The test equipment is suitably constructed for portable operation and may be used either for testing igniters in a workshop or when servicing an engine in situ, by using the power supply to the engine. In this respect, the test equipment may be provided with facility for testing the voltage level produced by the engine power supply. The housing 1 of the equipment is preferably of a robust construction, is water and dust resistant and brightly coloured. The equipment may be provided with various safety features. In particular, the equipment has two start push buttons spaced from one another by a distance great enough to prevent simultaneous actuation by only one hand. In this way, the equipment can only be started if the operator has both hands on the respective buttons, thereby ensuring that his hands are clear of any part that might become live.

It will be appreciated that the equipment may be modified in various ways and that it may be used for testing various different igniters, and is not restricted to igniters for aircraft gas-turbine engines.

What I claim is:

1. Equipment for testing operation of electrical igniters, comprising: a voltage source that produces a pulsed voltage output; first capacitive means; means connecting the output of said voltage source to charge said first capacitive means; second capacitive means; rectifier means connected in series with said second capacitive means, said second capacitive means and said rectifier means being connected in parallel with said first capacitive means; means connecting said igniter across said rectifier means; inductance means; a thyristor connected in series with said inductance means, said inductance means and said thyristor being connected in parallel with said first capacitive means; a thyristor control circuit; first sensing means that supplies signals indicative of breakdown of said igniter to said thyristor control circuit; second sensing means that supplies signals representative of the voltage across the igniter to said thyristor control circuit, the thyristor control circuit periodically rendering said thyristor conductive so as thereby to produce a voltage across said rectifier means and said igniter that is substantially equal to the sum of the voltages across said first and second capacitive means, the voltage across said igniter being increased in steps until breakdown occurs at the same voltage repeatedly for a predetermined number of times; and display means that provides a representation of the voltage at which repeated breakdown occurs.

2. Equipment for use in testing electrical igniters comprising: a voltage source that produces a pulsed voltage signal; first capacitive means; means connecting said voltage source with said first capacitive means such that said first capacitive means is progressively charged by said voltage source; second capacitive means; rectifier means connected in series with said second capacitive means, said second capacitive means and said rectifier means being connected in parallel with said first capacitive means such that said second capacitive means is progressively charged by said voltage source; means for connecting an electrical igniter to be tested across said rectifier means; inductance means; a thyristor connected in series with said inductance means, said inductance means and said thyristor being connected in parallel with said first capacitive means; a thyristor control circuit that periodically renders said thyristor conductive thereby producing a voltage pulse across said rectifier means and across the electrical igniter that is substantially equal to the sum of the voltages across said first and second capacitive means, the value of the pulse automatically increasing each time it is applied until breakdown of the igniter occurs repeatedly at the same voltage for a predetermined number of times; and display means that provides a representation of the voltage at which said repeated breakdown occurs.

3. Equipment according to claim 2, including comparator means and a voltage reference source, wherein said comparator means is connected to control the application of the voltage developed across said capacitive means to said igniter, in response to signals representative of the voltage across said igniter and signals from said reference source.

4. Equipment according to claim 3, wherein said thyristor is controlled by said comparator means.

5. Equipment according to claim 3, including counting means, said counting means progressively changing the value of signals from said reference source unless breakdown occurs of said igniter.

6. Equipment for testing operation of electrical igniters, comprising: capacitive means; means connecting said capacitive means with said igniter; a voltage source that increases the voltage across said capacitive means; means for automatically applying a voltage developed across said capacitive means to said igniter at predetermined intervals; the equipment automatically applying the same voltage across said igniter repeatedly for a predetermined number of times if breakdown occurs; and display means that provides a representation of the voltage at which said repeated breakdown occurs.

7. Equipment according to claim 2 or 6 wherein said display means that provides a representation of voltage, includes further capacitive means across which said voltage is applied, switching means that discharges said further capacitive means intermittently so that its voltage is thereby progressively reduced from its initial value to a lower predetermined value, and counter means that provides a count of the number of times said further capacitive means is discharged thereby providing an indication of the initial voltage across said further capacitive means.

8. Equipment according to claim 7 wherein said further capacitive means includes a capacitive divider.

9. Equipment according to one of claims 2 to 6 including inductive pick-off means providing signals representative of the voltage across said capacitive means.

* * * * *